(12) United States Patent
Juang et al.

(10) Patent No.: US 11,205,742 B2
(45) Date of Patent: Dec. 21, 2021

(54) LUMINESCENT MATERIAL AND LIGHT EMITTING DEVICE AND DISPLAY DEVICE USING THE SAME

(71) Applicant: Chi Mei Corporation, Tainan (TW)

(72) Inventors: Yuan-Ren Juang, Tainan (TW); Szu-Chun Yu, Tainan (TW); Keng-Chu Lin, Tainan (TW); Wei-Ta Chen, Tainan (TW); Yao-Tsung Chuang, Tainan (TW); Jen-Shrong Uen, Tainan (TW)

(73) Assignee: CHIMEI CORPORATION, Tainan (TW)

( * ) Notice: Subject to any disclaimer, the term of this patent is extended or adjusted under 35 U.S.C. 154(b) by 0 days.

(21) Appl. No.: 16/197,470

(22) Filed: Nov. 21, 2018

(65) Prior Publication Data
US 2019/0181306 A1   Jun. 13, 2019

(30) Foreign Application Priority Data
Dec. 8, 2017 (TW) ................. 106143106

(51) Int. Cl.
*H01L 33/50* (2010.01)
*C09K 11/08* (2006.01)
*C09K 11/64* (2006.01)

(52) U.S. Cl.
CPC ........ *H01L 33/502* (2013.01); *C09K 11/0883* (2013.01); *C09K 11/646* (2013.01); *H01L 33/507* (2013.01); *H01L 33/501* (2013.01); *H01L 33/504* (2013.01); *H01L 2933/0041* (2013.01)

(58) Field of Classification Search
CPC .. H01L 33/502–507; H01L 2933/0041; C09K 11/08; C09K 11/02
See application file for complete search history.

(56) References Cited

U.S. PATENT DOCUMENTS

| 7,495,383 | B2 | 2/2009 | Chua et al. | |
|---|---|---|---|---|
| 8,237,154 | B2 | 8/2012 | Jang et al. | |
| 10,030,851 | B2 | 7/2018 | Koole et al. | |
| 2006/0029802 | A1* | 2/2006 | Ying | C30B 29/60 428/403 |
| 2006/0082296 | A1* | 4/2006 | Chua | H05B 33/14 313/512 |
| 2007/0132052 | A1 | 6/2007 | Sargent et al. | |

(Continued)

FOREIGN PATENT DOCUMENTS

| CN | 108102640 A | 6/2018 |
|---|---|---|
| JP | 2010209314 A | 9/2010 |

(Continued)

OTHER PUBLICATIONS

Machine translation of CN102690658 (Year: 2012).*

(Continued)

*Primary Examiner* — Vincent Wall
(74) *Attorney, Agent, or Firm* — McClure, Qualey & Rodack, LLP

(57) ABSTRACT

A luminescent material, a light emitting device, and a display device are disclosed. The luminescent material includes particles and a phosphor. The particles include quantum dots and have an average diameter of 0.06 μm to 30 μm.

13 Claims, 7 Drawing Sheets

(56) References Cited

U.S. PATENT DOCUMENTS

| | | | | |
|---|---|---|---|---|
| 2007/0199109 | A1* | 8/2007 | Yi | B22F 1/02 428/332 |
| 2008/0012001 | A1* | 1/2008 | Gillies | C30B 7/00 257/9 |
| 2010/0051898 | A1* | 3/2010 | Kim | C09K 11/02 257/9 |
| 2010/0224831 | A1 | 9/2010 | Woo et al. | |
| 2011/0101387 | A1 | 5/2011 | Kinomoto | |
| 2011/0156575 | A1* | 6/2011 | Yu | B82Y 20/00 313/503 |
| 2011/0214488 | A1* | 9/2011 | Rose | E21B 47/1015 73/61.71 |
| 2014/0101980 | A1* | 4/2014 | Best | G09F 9/30 40/606.03 |
| 2015/0253474 | A1* | 9/2015 | Guo | B32B 17/06 362/97.2 |
| 2016/0027971 | A1* | 1/2016 | Anc | C09K 11/025 257/98 |
| 2016/0084476 | A1* | 3/2016 | Koole | F21V 9/32 362/84 |
| 2017/0267924 | A1* | 9/2017 | Kuwabata | C09K 11/621 |
| 2017/0035874 | A9 | 12/2017 | Juang et al. | |
| 2018/0151817 | A1 | 5/2018 | Cho et al. | |

FOREIGN PATENT DOCUMENTS

| | | |
|---|---|---|
| JP | 2016516853 A | 6/2016 |
| KR | 20080017553 A | 2/2008 |
| KR | 10-2015-0121722 A | 10/2015 |
| KR | 10-2015-0133790 A | 11/2015 |
| KR | 10-2017-0011616 A | 2/2017 |
| TW | 200708593 A | 3/2007 |
| TW | 201742910 A | 12/2017 |

OTHER PUBLICATIONS

Sathe et al., "Mesoporous Silica Beads Embedded with Semiconductor Quantum Dots and Iron Oxide Nanocrystals: Dual-Function Microcarriers for Optical Encoding and Magnetic Separation", Anal. Chem. 2006, 78, 5627-5632 (Year: 2006).*

Ma et al., "Highly bright water-soluble silica coated quantum dots with excellent stability", J. Mater. Chem. B, 2014, 2, 5043 (Year: 2014).*

Xie et al., "Synthesis and Photoluminescence Properties of -sialon: Eu2+ „Si6-zAlzOzN8-z:Eu2+...", Journal of The Electrochemical Society, 154 (10) J314-J319 (Year: 2007).*

Machine tranlsation of JP 2016-516853 (Year: 2016).*

Japanese Office Action dated Jun. 3, 2020, issued in application No. 2018-227046.

KIPO Office Action dated Jul. 1, 2020 in Korean application (No. 10-2018-0154789) with English translation.

Non-Final Office Action issued in U.S. Appl. No. 16/680,616, filed Nov. 12, 2019, dated May 12, 2021 (copy not provided).

TIPO Office Action dated Jun. 21, 2018 in corresponding Taiwan application (No. 106143106).

* cited by examiner

LUMINESCENT MATERIAL AND LIGHT EMITTING DEVICE AND DISPLAY DEVICE USING THE SAME

This application claims the benefit of Taiwan application Serial No. 106143106, filed Dec. 8, 2017, the subject matter of which is incorporated herein by reference.

BACKGROUND

Technical Field

The disclosure relates in general to a luminescent material and a light emitting device and a display device using the same, and particularly to a fluorescence luminescent material and a light emitting device and a display device using the same.

Description of the Related Art

A quantum dot is a material having good light absorption and luminescence properties. The quantum dot can emit a light having a narrow full width at half maximum (FWHM), and have high luminescence efficiency and a wide absorption spectrum, and thus can have high color purity and saturation. The quantum dot has been gradually applied to a display panel technique in recent years. Presently, when the quantum dots are applied, the quantum dots are directly dispersed in a solvent, and then coated on a desired position. However, the luminescent feature of the quantum dot has considerable relevance with a size thereof. The quantum dots are not only hard to be evenly distributed in the solvent, but also probably gathered into micron-sized quantum dot clusters. In this case, light-emitting uniformity is not easy to be improved, and the micron-sized quantum dot clusters may loss the light-emitting feature. On the other hand, the quantum dots preserved in a liquid form have high difficulty in application, and are not easy to be applied in various processing designs. Moreover, peripheries of the quantum dots and polymers such as ligands thereof have disadvantages of poor high-temperature endurance, which also limits the application of the quantum dots. Therefore, it is an important and urgent issue to develop a method for obtaining a quantum dot material having a long lifetime.

In addition, although a conventional known phosphor applied in a light emitting diode (LED) has a lower cost than a quantum dot, the phosphor has a color rendering poor than the quantum dot. Moreover, there is a quite huge difference in sizes of the phosphor and the quantum dot. As the phosphor and the quantum dot are used together, problems of mixing un-uniformity and self-absorption occur. Therefore, it is also an important issue to get a trade-off between a manufacturing cost without being increased significantly and improved color rendering and color saturation for the LED using both the phosphor and the quantum dot.

SUMMARY

The present disclosure relates to a luminescent material and a light emitting device and a display device using the same.

According to an embodiment of the present disclosure, a luminescent material is disclosed. The luminescent material comprises particles and a phosphor. The particles comprise quantum dots and have an average diameter of 0.06 μm to 30 μm.

According to another embodiment of the present disclosure, a light emitting device is disclosed. The light emitting device comprises a luminescent material. The luminescent material comprises particles and a phosphor. The particles comprise quantum dots and have an average diameter of 0.06 μm to 30 μm.

According to yet another embodiment of the present disclosure, a display device is disclosed. The display device comprises a luminescent material. The luminescent material comprises particles and a phosphor. The particles comprise quantum dots and have an average diameter of 0.06 μm to 30 μm. The display device is a television, a digital camera, a digital video camera, a digital photo frame, a mobile phone, a laptop, a computer monitor, a portable music player, a gaming console, an automobile monitor, a smart watch or a virtual reality glasses.

The above and other embodiments of the disclosure will become better understood with regard to the following detailed description of the non-limiting embodiment(s). The following description is made with reference to the accompanying drawings.

DETAILED DESCRIPTION

Embodiments of the present disclosure are disclosed in detail as the following accompanying with figures. It is should be noted that elements shown in the figure may be not drawn according to actual scales, and may be drawn with enlarged or reduced sizes optionally for sake of showing features of the present disclosure clearly. The same or similar elements in the specification and the figures may be labeled with the same or similar symbols.

Various features of the present disclosure are disclosed with the following various embodiments or examples, describing the elements and arrangements thereof. It is of course that the embodiments and examples are used for illustrating the present disclosure, and the present disclosure is not limited thereto. In addition, although different embodiments may be illustrated with the same symbols or marks, the repetition symbols or marks are just for sake of simple and clear disclosing the present disclosure, but not indicating specific relations between the illustrated different embodiments and/or structures.

Moreover, it should be understood that there may be additional steps before, during, or after the steps disclosed in the present disclosure. In addition, some steps in an embodiment may be replaced or omitted in another embodiment.

Figure 1:
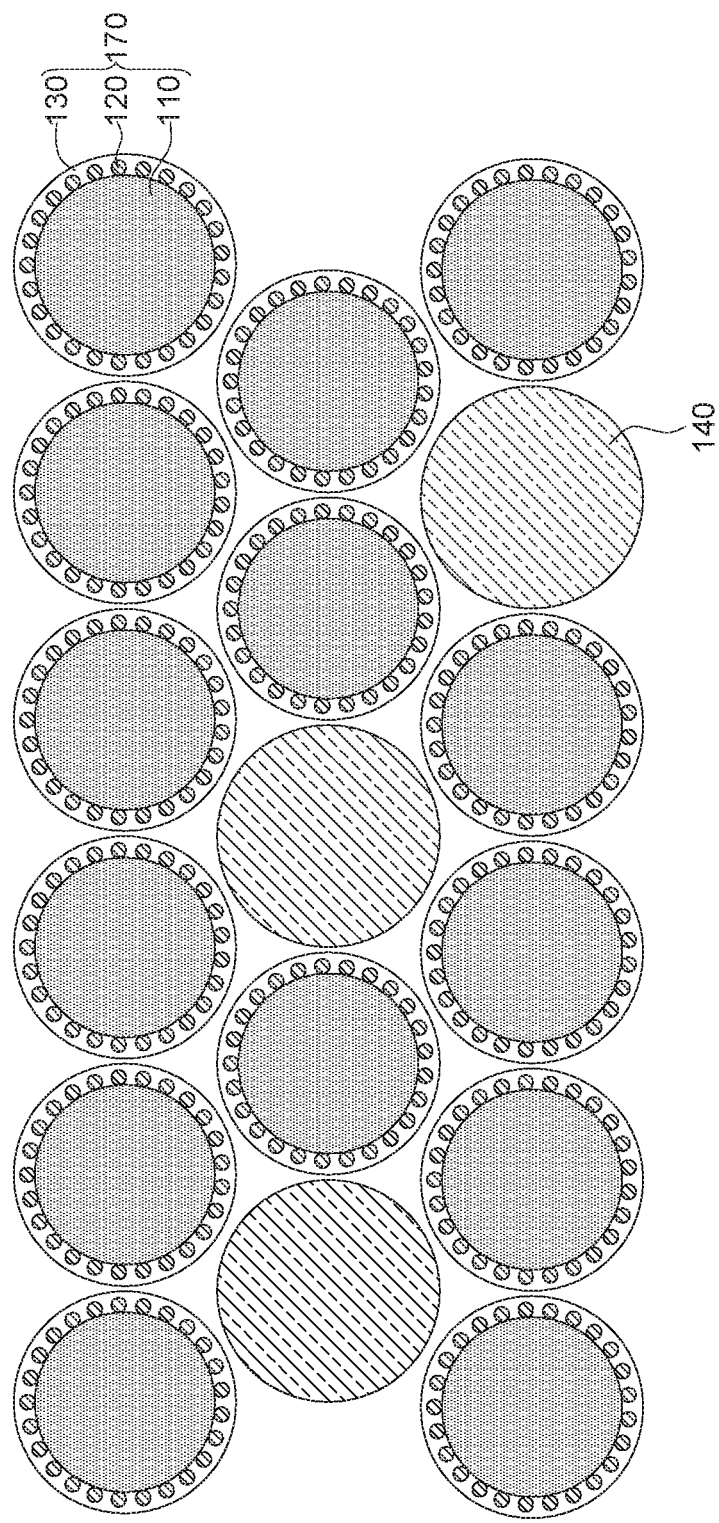
FIG. 1 is a schematic diagram of a luminescent material according to an embodiment.
Figure 2:
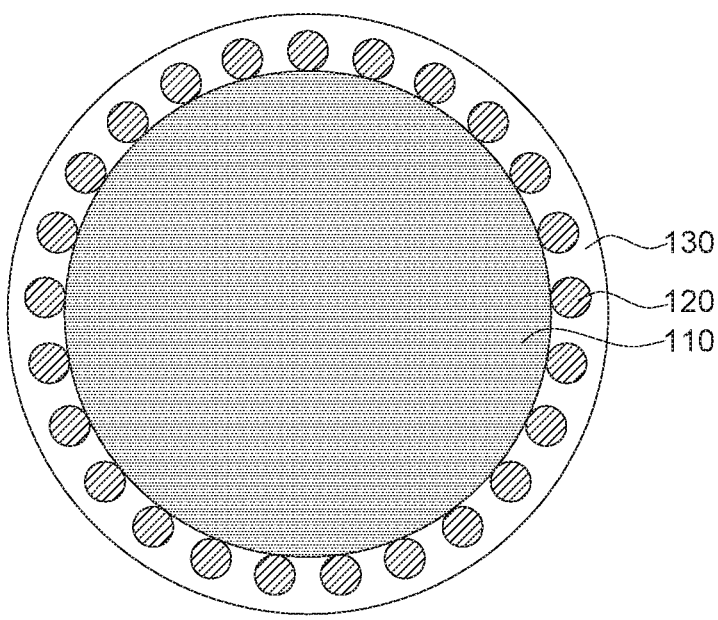
FIG. 2 is a schematic diagram of a particle according to a concept of an embodiment.

Refer to FIG. 1 and FIG. 2. FIG. 1 is a schematic diagram of a luminescent material 100 according to an embodiment. FIG. 2 shows a schematic diagram of a particle 170. The luminescent material 100 comprises the particles 170 and phosphors 140. The particle 170 comprises a core 110, quantum dots 120 and a sealing layer 130. The sealing layer 130 covers the core 110. The quantum dots 120 are disposed between the core 110 and the sealing layer 130.

In an embodiment, the particles 170 has an average diameter of 0.06 μm to 30 μm, by which the quantum dots 120 can be dispersed efficiently, and a huge amount of the quantum dots 120 can be adsorbed. Therefore, a size and a luminosity of the particle 170 can match the phosphor 140, and demands for high mixing uniformity and desired luminescent property can be achieved. For example, the average diameter of the particles 170 may be 0.10 μm to 30 μm, or 0.15 μm to 30 μm, or 0.06 μm to 10 μm, or 0.10 μm to 10 μm, or 0.15 μm to 10 μm, or 0.06 μm to 3 μm, or 0.10 μm to 3 μm, or 0.15 μm to 3 μm. In an enlarged view, the particle 170 of the present embodiment has a grain shape. The particles 170 may be somewhat different from each other. However, in the present embodiment, the diameter of the particle 170 is 0.06 μm to 30 μm, or is in a range disclosed as the foregoing. The average diameter of the particles 170 is an average value of the diameters of at least 20 particles. If the particle 170 is too small, the efficiency of dispersing the quantum dots 120 would be too low. On the contrary, if the particle 170 is over-large, the amount of the quantum dots 120 adsorbed thereto is insufficient, which results in a luminosity insufficient to match with the phosphor 140.

Since the average diameter of the particles 170 of the present embodiment is 0.06 μm to 30 μm, which is greater than the nanometer-level size of the quantum dot itself, the particle 170 can be used in form of a solid state, or can be added into a solvent and used in form of a liquid state, and uniformity of distribution of the particles 170 with the average diameter of 0.06 μm to 30 μm can be easily controlled in usage. After the particles 170 are uniformly dispersed, the average diameter of the particles 170 can be observed and measured by using a scanning electron microscope (SEM) or a transmission electron microscopy (TEM), and using a software such an IMAGE_PRO Plus 6.0 (IMAGE-PRO is a registered trademark of Media Cybernetics, Inc.) to select a particle and calculate quantitative values such as the average diameter etc. For example, the particles 170 may be uniformly dispersed by using ethanol or a polymer encapsulant material.

In the present embodiment, for example, the quantum dot 120 is selected from the group consisting of a Si-based nanocrystal, a perovskite nanocrystal, a group 12-16 compound semiconductor nanocrystal, a group 13-15 compound semiconductor nanocrystal and a group 14-16 compound semiconductor nanocrystal. However, the present disclosure is not limited thereto.

In an embodiment, the perovskite nanocrystal is an organic metal halide of $RNH_3PbX_3$, or a pure inorganic perovskite of $CsPbX_3$. In the $RNH_3PbX_3$, R may be $C_nH_{2n+1}$, n is in a range of 1-10. X of the perovskite nanocrystal is selected from the group consisting of chlorine, bromine, iodine, and a combination thereof. For example, the perovskite nanocrystal is selected from the group consisting of $CH_3NH_3PbI_3$, $CH_3NH_3PbCl_3$, $CH_3NH_3PbBr_3$, $CH_3NH_3PbI_2Cl$, $CH_3NH_3PbICl_2$, $CH_3NH_3PbI_2Br$, $CH_3NH_3PbIBr_2$, $CH_3NH_3PbIClBr$, $CsPbI_3$, $CsPbCl_3$, $CsPbBr_3$, $CsPbI_2Cl$, $CsPbICl_2$, $CsPbI_2Br$, $CsPbIBr_2$ and $CsPbIClBr$. However, the present disclosure is not limited thereto.

For the group 12-16 compound semiconductor nanocrystal, a group 12 element is selected from the group consisting of zinc, cadmium, mercury and a combination thereof; a group 16 element is selected from the group consisting of oxygen, sulfur, selenium, tellurium, and a combination thereof; a group 12-16 compound is, for example, selected from the group consisting of CdO, CdS, CdSe, CdTe, ZnO, ZnS, ZnSe, ZnTe, HgO, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, and HgZnSTe. However, the present disclosure is not limited thereto. For the group 13-15 compound semiconductor nanocrystal, a 13 group element is selected from the group consisting of aluminum, gallium, indium, and a combination thereof; a 15 group element is selected from the group consisting of nitrogen, phosphorus, arsenic, and a combination thereof; a group 13-15 compound is, for example, selected from the group consisting of GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, InCuSe and InAlPAs. However, the present disclosure is not limited thereto. For the group 14-16 compound semiconductor nanocrystal, a group 14 element is selected from the group consisting of tin, lead, and a combination thereof; a group 16 element is selected from the group consisting of sulfur, selenium, tellurium, and a combination thereof; a group 14-16 compound is, for example, selected from the group consisting of SnS, SnSe, SnTe, PbS, PbSe, PbTe, SnSeS, SnSeTe, SnSTe, PbSeS, PbSeTe, PbSTe, SnPbS, SnPbSe, SnPbTe, SnPbSeS, SnPbSeTe, and SnPbSTe. However, the present disclosure is not limited thereto.

Moreover, it should be understood for one skilled in the art that the quantum dot 120 having a nano-grain shape may be a structure of binary core, ternary core or quaternary core. Alternatively, the quantum dot 120 having a nano-grain shape may have a structure of core-shell, or a structure of core-multi-shell. Alternatively, the quantum dot 120 having a nano-grain shape may be a nano-grain treated with a doping or a classifying. In the present embodiment, the quantum dot 120 is a nano-grain having a core/shell structure of CdSe/ZnS preferably.

The quantum dot 120 having an inorganic surface atom may be treated by a surface modifying with using a sealing agent, which can improve inhibiting effect for aggregation of the quantum dots, and properly isolate the quantum dot 120 from an electron and chemical environment around the quantum dot 120. The sealing agent is an organic group. The sealing agent may comprise or may be essentially composed of a Lewis base compound. The sealing agent may comprise a monofunctional or multifunctional ligand. For example, the sealing agent may comprise a phosphine (such as trioctyl phosphine, triphenyl phosphine, tri-tert-butyl phosphine, etc.), a phosphine oxide (such as trioctyl phosphine oxide, triphenyl phosphine oxide, etc.), an alkyl phosphonic acid, an alkylamine (such as hexadecylamine, octylamine, etc.), an aryl amine, a pyridine, a long chain fatty acid, a thiophene, etc., but is not limited thereto.

A wavelength of a light emitted from the quantum dot may be varied with the average diameter of the quantum dots. Accordingly, a peak wavelength of the light emitted from the quantum dot may be controlled according to a material and a size of the quantum dot. In the present embodiment, for example, the average diameter of the quantum dots 120 is 1 nm to 25 nm, or 1 nm to 15 nm, or 1 nm to 10 nm. In the present embodiment, the quantum dots 120 may comprise a red quantum dot for emitting a red light, a green quantum dot for emitting a green light, a blue quantum dot for emitting a blue light, or a combination thereof. For example, the red quantum dots may have an average diameter of 3 nm to 25 nm, or 4 nm to 15 nm, or 5 nm to 10 nm. For example, the green quantum dots may have an average diameter of 2 nm to 20 nm, or 3 nm to 15 nm, or 4 nm to 9 nm. For example, the blue quantum dots may have an average diameter of 1 nm to 15 nm, or 2 nm to 10 nm, or 2 nm to 8 nm.

A photoluminescence (PL) is a technique capable of analyzing an energy level structure and a transition behavior for a material rapidly and reliably. An excitation spectrum of the photoluminescence can be analyzed to obtain important information of the material such as a kind of a dopant, an energy gap, and a component in a compound in the material, or a size, a carrier transmission path, and a lifetime of a quantum dot in the material, etc. For the quantum dot material, the photoluminescence analysis can be used for measuring a morphology of a quantum dot, a size of a quantum dot, an optical energy value of an electron transition between energy levels, and various reliabilities, etc. Therefore, the photoluminescence is a suitable evaluation tool for the quantum dot.

Regardless of an excitation source, once an electron is excited by exciting an atom, the electron release an energy difference between the energy levels of the electron falling from a high energy excitation state to a low energy ground state in form of light emission. When an emission spectrum of the quantum dot is analyzed, the following parameters are noted: (1) a wavelength and a strength of a peak of the emission spectrum; (2) a wavelength corresponding to two sides of a half peak width; (3) full width at half maximum (FWHM).

In an embodiment of the present disclosure, when the particle 170 is irradiated by a light of a wavelength equal or greater than 350 nm and smaller than a wavelength of a light emitted from the particle 170, for example, irradiated by a light of a wavelength of 390 nm to 500 nm, the particle 170, for example, emits a light having a peak wavelength of 400 nm to 700 nm and a full width at half maximum of 15 nm to 60 nm, or 20 nm to 60 nm.

In an embodiment of the present disclosure, when the quantum dot 120 is irradiated by a light of a wavelength equal or greater than 350 nm and smaller than a wavelength of a light emitted from the quantum dot 120, for example, irradiated by a light of a wavelength of 390 nm to 500 nm, the quantum dot 120, for example, emits a light having a peak wavelength of 400 nm to 700 nm and a full width at half maximum of 15 nm to 60 nm, or 20 nm to 60 nm. In an embodiment of the present disclosure, for example, after a red quantum dot is irradiated, the red quantum dot emits a light having a peak wavelength of 600 nm to 700 nm, or 605 nm to 680 nm, or 610 nm to 660 nm and having a full width at half maximum of 15 nm to 60 nm, or 20 nm to 60 nm. In an embodiment of the present disclosure, for example, after a green quantum dot is irradiated, the green quantum dot emits a light having a peak wavelength of 500 nm to 600 nm, or 510 nm to 560 nm, or 520 nm to 550 nm and having a full width at half maximum of 15 nm to 60 nm, or 20 nm to 60 nm. In an embodiment of the present disclosure, for example, after a blue quantum dot is irradiated, the blue quantum dot emits a light having a peak wavelength of 400 nm to 500 nm, or 430 nm to 470 nm, or 440 nm to 460 nm and having a full width at half maximum of 15 nm to 60 nm, or 20 nm to 60 nm. For example, the peak wavelength, the intensity and the full width at half maximum of the light emitted from the quantum dot are obtained by a photoluminescence analysis using a steady state fluorescence spectrometer (model No. FluoroMax-3) manufactured by Horiba company.

In an embodiment of the present disclosure, a weight percentage of the quantum dots 120 in the particle 170 may be 0.1% to 50%, and such particle 170 has a stable luminescence effect. In the disclosure, the weight percentage of the quantum dots 120 in the particle 170 refers to a percentage of a weight of the quantum dots 120 relative to a weight of the entire particle 170. Moreover, the weight percentage of the quantum dots 120 in the particle 170 may also be 1% to 45%, or 2% to 40%. If the weight percentage of the quantum dots 120 in the particle 170 is lower than 0.1%, a concentration of the quantum dots 120 in the particle 170 is relatively low, which results in the whole luminescence efficiency being poor. If the weight percentage of the quantum dots 120 in the particle 170 is higher than 50%, self-absorption phenomenon easily occurs to the quantum dots 120, which results in decreasing of the whole luminescence efficiency, and a red shift to the emitted light. The weight percentage can be obtained by means of necessary analysis, for example, an inductively coupled plasma (ICP) spectrum analysis method, etc.

In the present embodiment, a material for the core 110 may be polymer, for example, selected from the group consisting of an organic polymer, an inorganic polymer, a water-soluble polymer, an organic solvent-soluble polymer, a biopolymer and a synthetic polymer. For example, the material for the core 110 may be selected from the group consisting of polysiloxane, polyacrylate, polycarbonate, polystyrene, polyethylene, polypropylene, polyketone, polyether ether ketone, polyester, polyamide, polyacrylamide, polyolefin, polyacetylene, polyisoprene, polybutadiene, poly(vinylidene fluoride), poly(vinyl chloride), ethylene vinyl acetate, polyethylene terephthalate, polyurethane and a cellulose polymer. In the present disclosure, the material for the core 110 may an inorganic medium, for example, selected from the group consisting of silica gel, bentonite, glass, quartz, kaolin, silicon dioxide, aluminum oxide and zinc oxide. In the present disclosure, the sealing layer 130 and the core 110 may have the same material or different materials. In the present disclosure, the material for the core 110 is preferably a silicon oxide, for example, selected from the group consisting of polysiloxane, glass, water glass and silicon dioxide. In the present disclosure, the material for the core 110 is a non-photoluminescent material, and the non-photoluminescent material is not as a photoluminescent material such as the quantum dot 120 or the phosphor 140, irradiated by a light of low peak wavelength (such as 390 nm to 500 nm), and can emit a light having a peak wavelength (such as 400 nm to 700 nm) higher than the aforementioned low peak wavelength. Therefore, in the present disclosure, the core 110 does not affect the luminescent properties of the quantum dot 120 or the phosphor 140.

In the present embodiment, the material for the sealing layer 130 may be a polymer, for example, selected from the group consisting of an organic polymer, an inorganic polymer, a water-soluble polymer, an organic solvent-soluble polymer, a biopolymer and a synthetic polymer. For example, the material for the sealing layer 130 may be selected from the group consisting of polysiloxane, polyacrylate, polycarbonate, polystyrene, polyethylene, polypropylene, polyketone, polyether ether ketone, polyester, polyamide, polyimide, polyacrylamide, polyolefin, polyacetylene, polyisoprene, polybutadiene, poly(vinylidene fluoride), poly(vinyl chloride), ethylene vinyl acetate, polyethylene terephthalate, polyurethane and a cellulose polymer. In the present embodiment, the material for the sealing layer 130 may be an inorganic medium, for example, selected from the group consisting of silica gel, bentonite, glass, quartz, kaolin, silicon dioxide, aluminum oxide and zinc oxide. In the present embodiment, the material for the sealing layer 130 is preferably a silicon oxide, for example, selected from the group consisting of polysiloxane, glass and silicon dioxide.

Polysiloxane is obtained through a hydrolysis and condensation reaction occurred by adding water to a siloxane compound as the following formula (I):

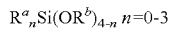  formula (I);

$R^a$ represents an aromatic group with a carbon number of 6-15. $R^b$ represents an alkyl group with a carbon number of 1-5. For example, $R^a$ is a phenyl group, a tolyl group, a p-hydroxyphenyl group, a 1-(p-hydroxyphenyl)ethyl group, a 2-(p-hydroxyphenyl)ethyl group, a 4-hydroxyl-5-(p-hydroxyphenylcarbonyloxy)pentyl group or a naphthyl group, but not limited thereto. For example, $R^b$ is a methyl group, an ethyl group, an n-propyl group, an isopropyl group or a n-butyl group, but not limited thereto. In the present embodiment, the polysiloxane is preferably obtained through the hydrolysis and condensation reaction occurred by adding water to tetraethoxysilane (TEOS).

In the present embodiment, the sealing layer 130 has a thickness sufficient to completely encapsulate the quantum dots 120. For example, the sealing layer 130 may have a thickness of 0.1 nm to 25 nm, or 0.5 nm to 25 nm. The sealing layer 130 having the thickness within the forgoing range can provide a sufficient protection effect to the quantum dots 120, and can avoid a poor luminescence efficiency resulted from an over-separation distance of the quantum dot 120 from an outer surface of the particle 170.

In the present embodiment, for example, the cores 110 have an average diameter of 0.05 μm to 30 μm, or 0.09 μm to 10 μm, or 0.14 μm to 3 μm. In an embodiment, when the cores 110 have the average diameter of 0.06 μm to 30 μm, the particle 170 in the luminescent material 100 can maintain a preferable luminescence retention rate. In the present embodiment, the material of the cores 110 may have a porous characteristic, and the cores 110 have an average surface aperture diameter of 3 nm to 100 nm. As the core 110 is a porous core, it can benefit to the quantum dots 120 to uniformly and stably adsorb onto the core 110, and have a suitable distance between the quantum dots 120 to avoid losing the light-emitting feature due to an excessive close distance between the quantum dots 120. In an embodiment, for example, when the quantum dots 120 are the red quantum dots, the cores 110 have the average surface aperture diameter of 7 nm to 40 nm, or 7 nm to 35 nm, or 7 nm to 30 nm. For example, when the quantum dots 120 are the green quantum dots, the cores 110 have the average surface aperture diameter of 5 nm to 30 nm, or 5 nm to 25 nm, or 5 nm to 20 nm. For example, when the quantum dots 120 are the blue quantum dots, the cores 110 have the average surface aperture diameter of 3 nm to 25 nm, or 3 nm to 20 nm, or 3 nm to 15 nm. For example, the core 110 has a specific surface area of 100 m$^2$/g to 1000 m$^2$/g. In an embodiment of the present disclosure, the core 110 uses a porous micro grain such as a silicon dioxide grain. The core may have a hydrophobicity property (i.e. lipophilicity property), and the porous micro grain may be a silicon dioxide grain having a hydrophobicity property. The hydrophobic core may be obtained by modifying a surface of the silicon dioxide grain having a hydrophilic silanol group on the surface of which with using an organic silane compound as shown in the following formula (II):

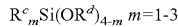  formula (II);

$R^c$ represents an alkyl group having a carbon number of 3-20. $R^d$ represents an alkyl group having a carbon number of 1-5. In the present embodiment, for example, $R^c$ is a propyl group, an octyl group, a nonyl group, a decyl group, or a hexadecyl group. For example, $R^d$ is a methyl group, an ethyl group, an n-propyl group, an isopropyl group or an n-butyl group.

In another embodiment, the cores 110 may be a fumed silica, which may be an aggregate of primary grains gathered together and unable to be separated from each other. The core 110 may have a hydrophobicity property. For example, the core 110 may have an alkyl group of a carbon number of 3-20, a carbon number of 3-18, or a carbon number of 3-16, which provides the hydrophobicity property to the core 110. In an embodiment, the alkyl group is formed by using an organic silane to modify a surface of the aggregate having a hydrophilic silanol group on the surface of the aggregate, by which the alkyl group is grated onto the aggregate so as to form the cores 110. In such embodiment, the surface of the core 110 has a terminal functional group as the following chemical formula III:

[chemical formula III]

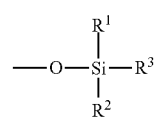

$R^1$ is —OCH$_3$. $R^2$ is —OCH$_3$. $R^3$ is an alkyl group having a carbon number of 3-20, such as an alkyl group having a carbon number of 3-18, or an alkyl group having a carbon number of 3-16. Correspondingly, the organic silane used for the modifying may be an organic silane having an alkyl group having a carbon number of 3-20, such as an organic silane having an alkyl group having a carbon number of 3-18, or an organic silane having an alkyl group having a carbon number of 3-16. For example, the organic silane used for the modifying may be propyl trimethoxysilane, octyl trimethoxysilane, hexadecyl trimethoxysilane, etc.

In an embodiment using silicon dioxide as the material of the porous core 110, the cores 110 may be porous cores having the average diameter of 1 μm to 5 μm, the average surface aperture diameter of 5 nm to 15 nm, the specific surface area of 500 m$^2$/g to 900 m$^2$/g. Alternatively, the cores 110 may be porous cores having the average diameter of 1 μm to 5 μm, the average surface aperture diameter of 10 nm to 30 nm, the specific surface area of 250 m$^2$/g to 750 m$^2$/g. Alternatively, the cores 110 may be porous cores having the average diameter of 0.5 μm to 1.5 μm, the average surface aperture diameter of 5 nm to 15 nm, the specific surface area of 200 m$^2$/g to 600 m$^2$/g. Alternatively, the cores 110 may be porous cores having the average diameter of 0.1 μm to 0.5 μm, the average surface aperture diameter of 3 nm to 12 nm, the specific surface area of 100 m$^2$/g to 500 m$^2$/g.

In the present embodiment, after the particle 170 is tested under a high temperature of 250° C. for 2 hours, it exhibit a retention ratio of a photoluminescence (PL) intensity being 50-75%, relative to the PL measurement intensity before being treated with the high temperature. On the other hand, a retention ratio of luminescence efficiency of a conventional quantum dot without being treated (i.e. without an adsorption to a core, without sealing) after the same high temperature test is only 2%. Accordingly, it proves that the structure of the particle of the present disclosure avails improving high temperature resistance capability of the quantum dot.

The phosphor 140 may have a phosphor material the same as or different from the quantum dot 120. For example, the phosphor 140 may be selected from the group consisting of garnet, sulphide, thiometallate, silicate, oxide, oxynitride, nitride, and selenide based phosphors.

The phosphor 140 may comprise an inorganic phosphor material and/or an organic phosphor material. For example, the inorganic phosphor material may be an aluminate phosphor powder (such as LuYAG, GaYAG, YAG, etc.), a silicate phosphor powder, a sulfide phosphor powder, a nitride phosphor powder, a fluoride phosphor powder, etc. The organic phosphor material may comprise a single molecular structure, a polymolecular structure, an oligomer, a polymer, or a combination thereof. A compound of the organic phosphor material may comprise a group of perylene, a group of benzimidazole, a group of naphthalene, a group of anthracene, a group of phenanthrene, a group of fluorene, a group of 9-fluorenone, a group of carbazole, a group of glutarimide, a group of 1,3-diphenylbenzene, a group of benzopyrene, a group of pyrene, a group of pyridine, a group of thiophene, a group of 2,3-dihydro-1H-benzo[de]isoquinoline-1,3-dione, or a combination thereof. For example, a green phosphor powder may be β-SiAlON, γ-AlON, or a combination thereof. For example, a yellow phosphor material may be YAG:Ce, and/or an inorganic yellow phosphor powder of an oxynitride, a silicate or a nitride, and/or an organic yellow phosphor powder. For example, a red phosphor powder may comprise a manganese-doped fluoride phosphor powder. Alternatively, the red phosphor powder may comprise (Sr,Ca)S:Eu, $(Ca,Sr)_2Si_5N_8$:Eu, $CaAlSiN_3$:Eu (also referred as to CASN), $(Sr,Ba)_3SiO_5$:Eu and $Sr(LiAl_3N_4)$:Eu$^{2+}$ (also referred as to SLA). In the present embodiment, the material of the phosphor 140 is preferably the green phosphor β-SiAlON, which has a main peak wavelength of 530 nm to 550 nm, a full width at half maximum of 40 nm to 60 nm. In an embodiment, the green phosphor β-SiAlON has a main peak wavelength of 542 nm, and a full width at half maximum of 54 nm. In another embodiment, the phosphor 140 is the green phosphor YAG, which has a main peak wavelength of 530 nm to 550 nm, and a full width at half maximum of 70 nm to 108 nm. In an embodiment, the green phosphor YAG has a main peak wavelength of 532 nm, and a full width at half maximum of 106 nm.

In embodiments, the quantum dots 120 can be isolated from the phosphors 140 and the external environment by the sealing layer 130, and thus a luminescence property of the quantum dots 120 is not affected by an external substance or a reaction with the phosphors 140. Therefore, a reliability of the luminescent material 100 and a product device using the same can be improved.

In the present embodiment, for the luminescent material 100, the material of the quantum dots 120 comprised by the particle 170 is preferably the green quantum dot, and the material of the phosphors 140 is preferably the green phosphor. In view of increasing a luminance and a luminous intensity, and decreasing a full width at half maximum of the luminescent material, the green phosphor has the main peak wavelength of 510 nm to 560 nm, and the full width at half maximum of 40 nm to 108 nm. In the present embodiment, the luminescent material has the green phosphors preferably having the main peak wavelength of 530 nm to 550 nm, and the full width at half maximum of 40 nm to 60 nm. In another embodiment, the luminescent material has the green phosphors preferably having the main peak wavelength of 530 nm to 550 nm, and the full width at half maximum of 70 nm to 108 nm.

In embodiments, the phosphors of the luminescent material may have a content of 0.1 wt % to 40 wt % based on a total weight of the particles and the phosphors as 100 wt %. In addition, in a whole consideration for a cost without a substantial increase and for an increase for a color rendering and a color saturation of a LED, the phosphors preferably have the content of 5 wt % to 40 wt % based on the total weight of the particles and the phosphors as 100 wt %. Moreover, in a whole consideration for increasing the luminance and the luminous intensity, and for decreasing the full width at half maximum of the luminescent material, the phosphors preferably has the content of 5 wt % to 15 wt % based on the total weight of the particles and the phosphors as 100 wt %.

In the present embodiment, the quantum dots 120 are incorporated into an optical transparent medium (the core 110, the sealing layer 130) of the luminescent material 100. Therefore, the quantum dot 120 can be optically connected a light source so as to be excited by a primary light emitted from a light source, and then emit a secondary light. For example, the light source may be a LED, a laser light source, an arc light, or a blackbody light source, etc., and not limited thereto. In some embodiments, required luminous intensity and wavelength of a light emitted from a whole device may be achieved by only the secondary light. Alternatively, required luminous intensity and wavelength of a light emitted from a whole device may be achieved by mixing colors of the primary light and the secondary light properly. Alternatively, a size, a shape and a composition of the optical transparent medium, and a size and an amount of the quantum dots of each kind in the optical transparent medium may be adjusted to control a light emitted from the luminescent material and a subsequent light mixing to produce a light of required color and luminous intensity.

In the present embodiment, the luminescent material may be applied in an encapsulant material for packaging a LED. For example, the encapsulant material may be an epoxy resin, a polysiloxane resin, an acrylate resin, a glass, etc., and not limited thereto. The LED of this kind may be used for a back light unit or a light emitting element for a light emitting device of other kinds. The LED of this kind may be applied for a quantum dot light emitting diode (QLED) display device using an array of a plurality of LEDs each corresponding to one pixel.

Figure 3:
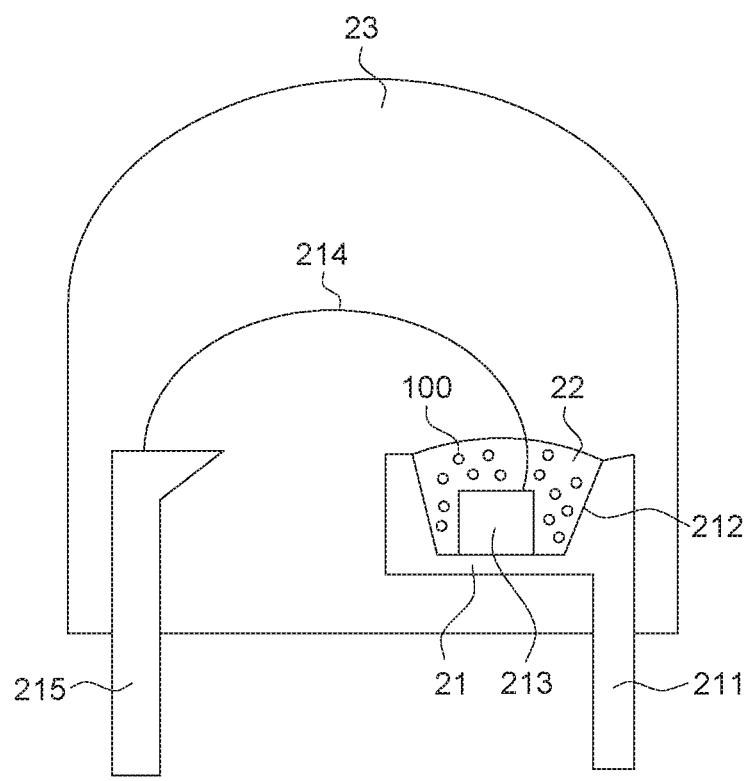
FIG. 3 illustrates a cross-section view of a light emitting device in an embodiment.

FIG. 3 shows a cross-sectional view of a light emitting device according to an embodiment of the present disclosure. The light emitting device comprises a light emitting unit 21, a phosphor layer 22, and an encapsulation layer 23. The light emitting unit 21 comprises a base 211 having a conductive characteristic and having a concave bearing surface 212, a light emitting element 213 disposed in the concave bearing surface 212 and electrically connected to the base 211, a connection wire 214 electrically connected to the light emitting element 213, and a conductive wire 215 electrically connected to the connection wire 214. The base 211 and the conductive wire 215 can cooperate to supply an external electrical energy to the light emitting element 213. The light emitting element 213 can convert the electrical energy to light energy and emit it out. In an embodiment, the light emitting element 213 uses a commercial available InGaN light emitting element (EPISTAR Corporation) of light emitting wavelength of 455 nm, and is adhered on the concave bearing surface 212 of the base 211 with a conductive silver paste (BQ6886, Uninwell International). The light emitting element 213 is electrically connected to the conductive wire 215 through the connection wire 214 extended from the top surface of the light emitting element 213. The phosphor layer 22 covers the light emitting element 213. After the luminescent material 100 contained in the phosphor layer 22 is excited by a light emitted from the light emitting element 213, the luminescent material 100 converts the light emitted from the light emitting element 213 to emit a light having a wavelength different from the wavelength of the exciting light. In the present embodiment, the phosphor layer 22 is formed by coating a polysiloxane resin with the luminescent material 100 contained therein on an external surface of the light emitting element 213 followed by a drying and a curing.

In the present disclosure, the luminescent material may use the quantum dots and the phosphors of various colors and materials. When more kinds of the quantum dots and the phosphors with different compositions (i.e. more different emission wavelengths) are used, the light emitting device can achieve a wider emission spectrum, even achieve a full spectrum for demands. Therefore, using the luminescent material according to the present disclosure for the display device can improve a color gamut, a color purity, a color trueness, NTSC, etc., effectively. In embodiments, the NTSC of the display device may be adjusted by the phosphors disposed on a LED chip in a LED element to achieve NTSC 100% and reduce the manufacturing cost.

In an embodiment, the light emitting device can achieve a demand of NTSC 100% by comprising the luminescent material, a red light converting material and a blue LED chip. The luminescent material comprises green particles (i.e. the particles for green color) and green phosphors (i.e. the phosphors for green color). The red light converting material is for emitting a red light having a peak wavelength of 600 nm to 700 nm. The red light converting material comprises red phosphor powders or red particles. The red phosphor powder is for emitting a primary light having a peak wavelength of 620 nm to 670 nm, and a full width at half maximum of 8 nm to 82 nm. In the present embodiment, the red phosphor powder is preferably for emitting a primary light having peak wavelength of 620 nm to 650 nm, and a full width at half maximum of 8 nm to 30 nm. In an embodiment, the red phosphor powder uses PFS and is for emitting a primary light having a peak wavelength of 631 nm and a full width at half maximum of 10 nm. In the present embodiment, another red phosphor powder is preferably for emitting a primary light having a peak wavelength of 655 nm to 670 nm, and a full width at half maximum of 50 nm to 82 nm. In an embodiment, the red phosphor powder uses CASN, and is for emitting a primary light having a peak wavelength of 659 nm and full width at half maximum of 80 nm. A material for the red phosphor powder may be a red phosphor powder of PFS preferably. The red particle comprises the red quantum dots, and the red particle is preferably for emitting a primary light having a peak wavelength of 632 nm to 672 nm, and a full width at half maximum of 20 nm to 40 nm. In an embodiment, the red particle is for emitting a primary light having a peak wavelength of 652 nm and a full width at half maximum of 35 nm.

In the present embodiment, the light emitting device comprises the luminescent material, the red phosphor powders and the blue LED chip. The luminescent material comprises the green particles and the green phosphors. For achieving the demand of NTSC 100%, the maximum amount of the green phosphors mixed in the luminescent material may be 27.2 wt % of the luminescent material.

In the present embodiment, the light emitting device comprises the luminescent material, the red particles and the blue LED chip. The luminescent material comprises the green particles and the green phosphors. For achieving the demand of NTSC 100%, the maximum amount of the green phosphors mixed in the luminescent material may be 37.9 wt % of the luminescent material.

Figure 4A:
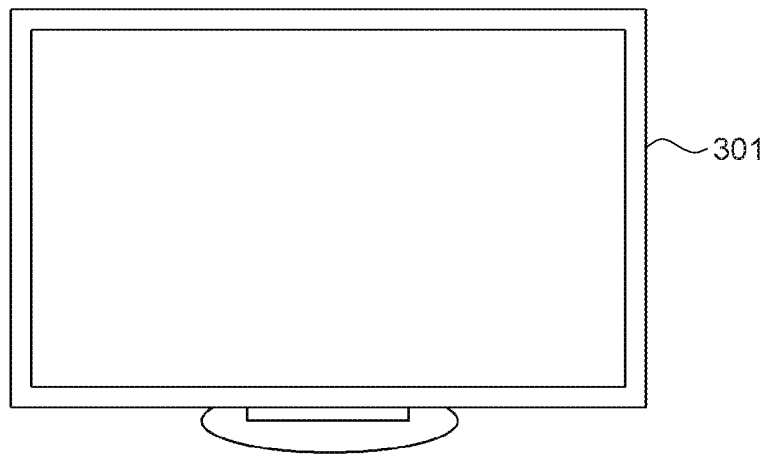
FIG. 4A to FIG. 4J are schematic diagrams of display devices according to concepts of embodiments.
Figure 4B:
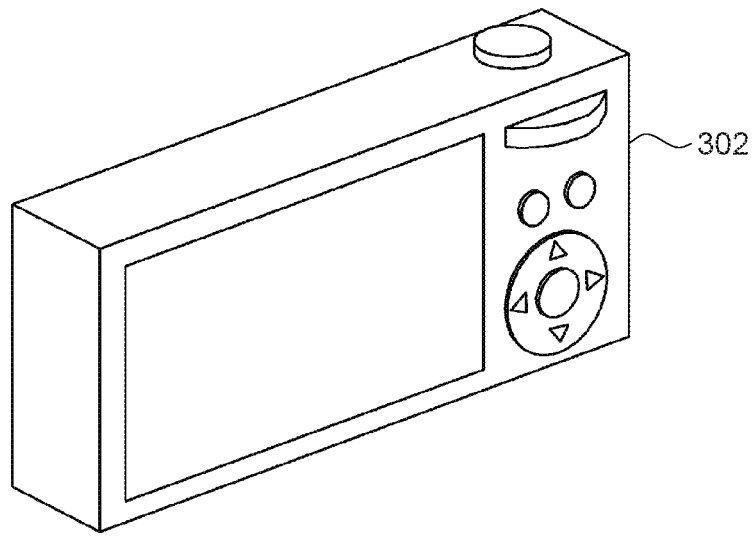
Figure 4C:
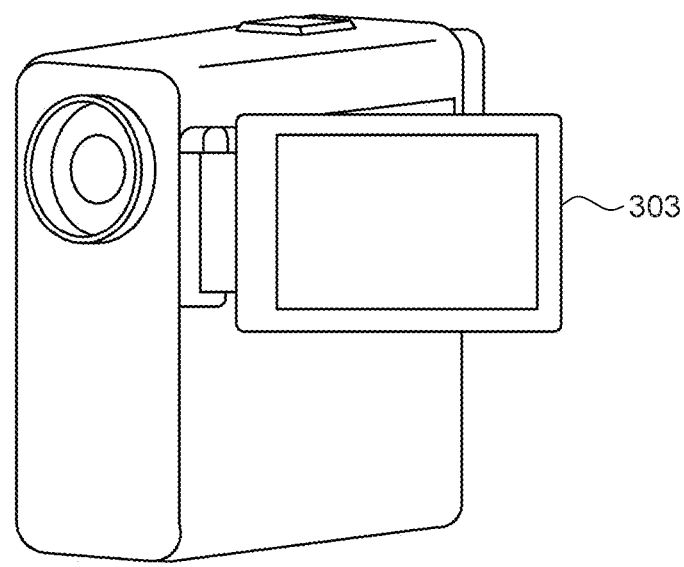
Figure 4D:
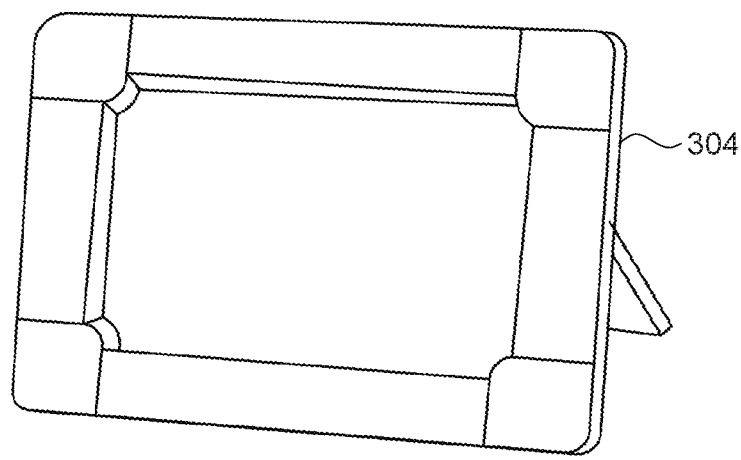
Figure 4E:
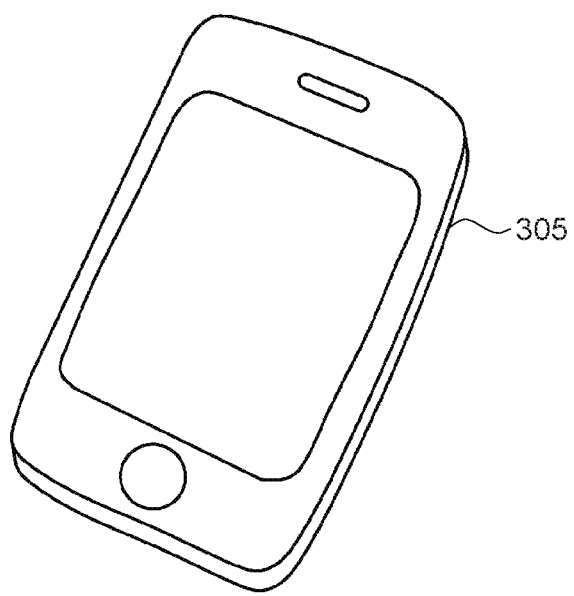
Figure 4F:
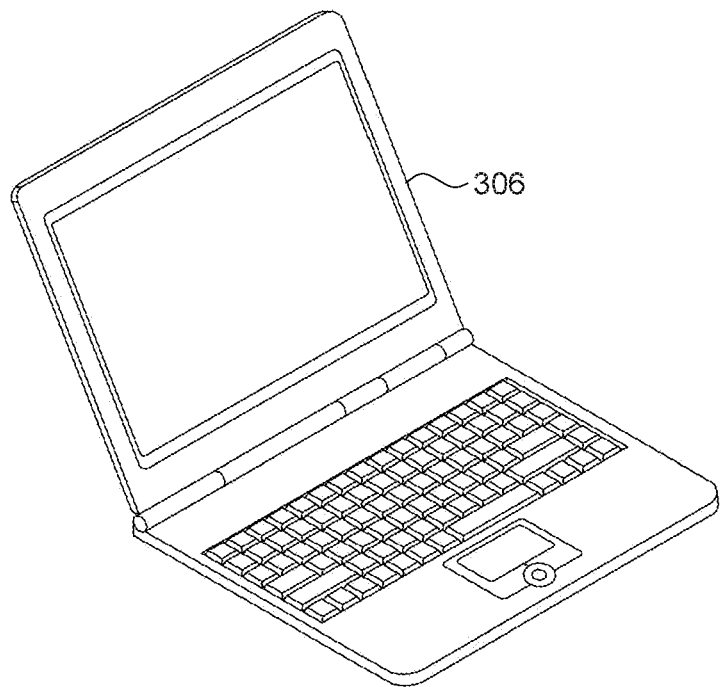
Figure 4G:
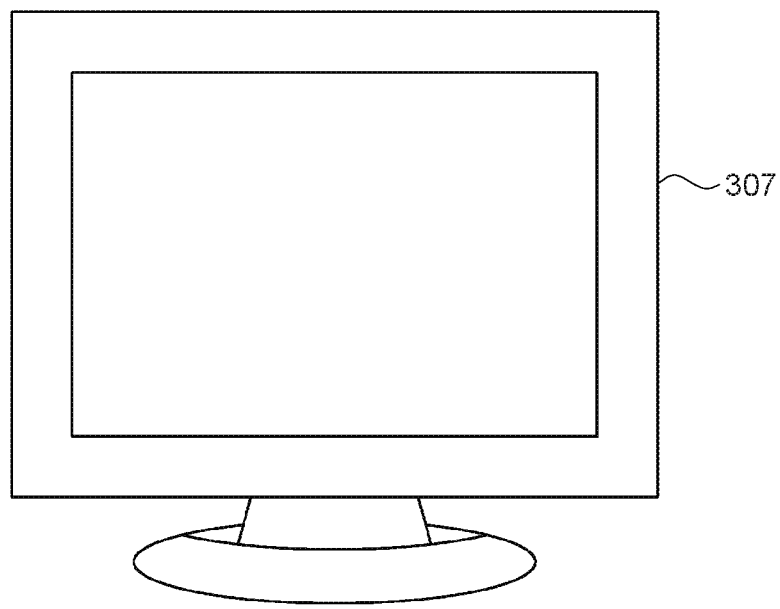
Figure 4H:
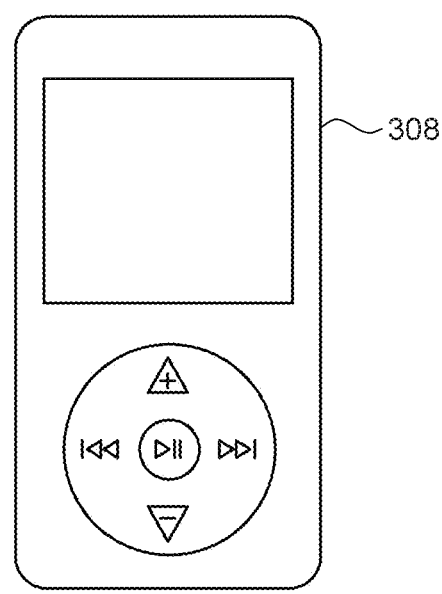
Figure 4I:
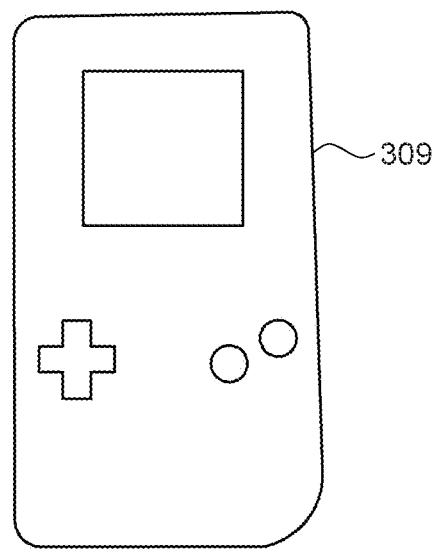
Figure 4J:
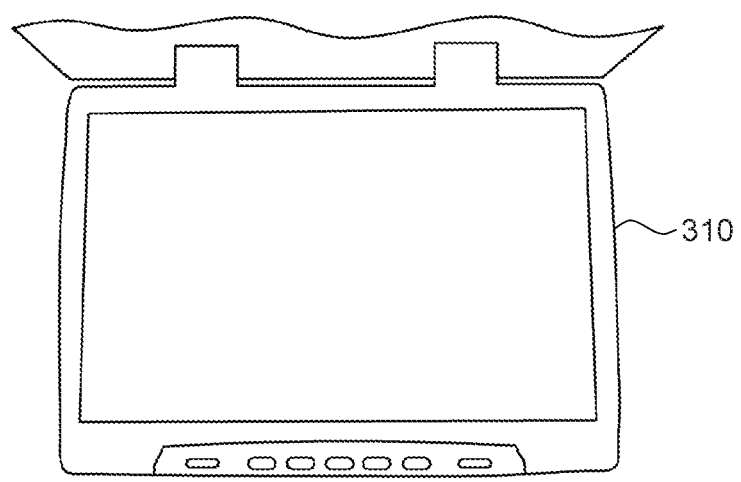

In the present disclosure, the luminescent material may be applied in various display devices, for example, a television 301 (which may be referred to as a television receiver) (as shown in FIG. 4A), a digital camera 302 (as shown in FIG. 4B), a digital video camera 303 (as shown in FIG. 4C), a digital photo frame 304 (as shown in FIG. 4D), a mobile phone 305 (as shown in FIG. 4E), a laptop 306 (as shown in FIG. 4F), a mobile computer, a computer monitor 307 (as shown in FIG. 4G), a portable gaming console, a portable information terminal, a portable music player 308 (as shown in FIG. 4H), a gaming console 309 (as shown in FIG. 4I), an automobile monitor 310 (as shown in FIG. 4J) and a wearable device (such as a smart watch or virtual reality glasses).

It should be understood that the luminescent material of the present disclosure is not limited to the encapsulant material for the LED, and may be applied for an optical film, an optical plate, a transparent element, an optical part, a back light unit, a light emitting device, a color converting material, an optical material, an oil ink, a labeling agent, etc.

In the present embodiment, the luminescent material may be manufactured by a method comprising the following steps.

A quantum dot solution and a core solution are mixed to produce the cores attached with the quantum dots. The cores attached with the quantum dots and a sealing material are mixed in a solvent to produce the particles having the cores, the sealing layer encapsulating the core, and the quantum dots disposed between the sealing layer and the core. The particles and the phosphors are mixed in a solvent to produce the luminescent material.

Specifically, the step for producing the cores attached with the quantum dots is mixing a solution including quantum dots or having quantum dots substantially uniformly distributed therein, with a solution including cores or having cores substantially uniformly distributed therein. The step for producing the particles having the core, the sealing layer encapsulating the core, and the quantum dots disposed between the sealing layer and the core is mixing the cores attached with the quantum dots obtained from the previous step with the sealing material in the solvent so as to make the sealing layer composed of the sealing material encapsulating the core attached with the quantum dots through a physical reaction and/or a chemical reaction. The quantum dots can adsorb onto the core uniformly and effectively by properly adjusting a composition ratio of the core and the quantum dots, and physical and chemical conditions in a solution system (for example, a material ratio, a change in a temperature, a material characteristic, and a kind of a solvent). Similarly, the sealing layer can be formed to provide a good protection effect to the quantum dots by properly adjusting a composition ratio of the cores attached with the quantum dots and the sealing material, and physical and chemical conditions in a solution system (for example, a material ratio, a change in a temperature, a material characteristic, and a kind of a solvent). The step for producing the luminescent material is mixing the particles obtained from the previous step with the phosphors in the solvent so as to make the particles and the phosphors uniformly mixed to form the luminescent material. The luminescent material can have the required luminescent property by properly adjusting a composition ratio of the particles and the phosphors.

In the present embodiment, in the step for producing the cores attached with the quantum dots, the quantum dot solution is the solution formed by mixing the quantum dots and n-hexane. The quantum dots occupy 0.1 wt % to 5 wt % of the quantum dot solution. In the present embodiment, in the step for producing the cores attached with the quantum dots, the core solution is the solution formed by mixing the cores and n-hexane. The cores occupy 0.5 wt % to 10 wt % of the core solution. In the present embodiment, the step for producing the cores attached with the quantum dots comprises standing the solution and then performing a centrifugal filtration. In the present embodiment, in the step for producing the particles having the core, the sealing layer encapsulating the core, and the quantum dots disposed between the sealing layer and the core, the step for mixing the cores attached with the quantum dots with the sealing material in the solvent for producing the particles comprises: adding tetraethoxysilane and ammonium hydroxide into the ethanol added with the cores attached with the quantum dots, and sequentially performing centrifugal separation, cleaning, centrifugal separation and drying after stirring the solution at a room temperature. In the present embodiment, the step of mixing the particles with the phosphors in the solvent to form the luminescent material comprises: dispersing the particles into a toluene solvent, and dispersing the phosphors into another toluene solvent, and then well mixing and stirring the two solutions, and then sequentially performing centrifugal separation and drying step.

The aspects, characteristics, and the advantages of the present disclosure may be better understood by reference to the following specific embodiments:

Quantum Dot Synthesis Example 1

Cadmium oxide (CdO) of 18 mg, zinc acetate (ZnAc) of 813 mg and oleic acid of 7 mg were added into a three-necked flask. Then, octadecene (ODE) of 15 ml was added, and the solution was heated and mixed to react in a vacuum environment under a temperature of 120° C. Then, nitrogen gas was filled in the three-necked flask, and the temperature was elevated to 290° C. Then, trioctylphosphine selenide (TOP-Se) of 2.1 ml, 0.0009 mol and sulfur (S) of 58 mg were injected and the solution was heated under the temperature of 290° C. to react. Then n-dodecyl mercaptan (DDT) of 0.5 ml and octadecene of 2.4 ml were injected, and zinc acetate of 525 mg, oleic acid of 1.83 ml and octadecene of 4 ml were injected, and sulfur of 309 mg and trioctylphosphine of 5 ml were injected. Then, the solution was stirred to produce a yellow green suspension liquid. Then the suspension liquid was cooled down, and a precipitating was performed to the suspension liquid by using ethanol of 300 ml so as to obtain a precipitate. Then a centrifugal separation was performed to the precipitate to produce green quantum dots, which can emit a light having a peak wavelength of 528 nm and a full width at half maximum of 24 nm.

Quantum Dot Synthesis Example 2

Cadmium oxide (CdO) of 1.361 g and oleic acid of 20 mg were added into a three-necked flask. Then, octadecene (ODE) of 30 ml was added, and the solution was heated and mixed to react in a vacuum environment under a temperature of 180° C. Then, nitrogen gas was filled in the three-necked flask, and the temperature was elevated to 250° C. Then, trioctylphosphine selenide (TOPSe) of 0.7 ml, 0.56 mmol was injected and the solution was heated under the temperature of 250° C. and was stirred to react until a dark brown solution was produced. Then the temperature was cooled down to 120° C. Zinc acetate ($Zn(Ac)_2$) of 0.969 g was added to the solution, and then the solution was dewatered by vacuumizing. Nitrogen gas was filled in the three-necked flask, and the temperature was elevated to 250° C. Then trioctylphosphine sulfide (TOPS) of 8 ml, 12 mmol was injected into the solution. The solution was reacted under nitrogen gas at 250° C. After the reaction was finished, the solution was cooled down to the room temperature. Then a precipitating was performed to the solution by using ethanol of 300 ml so as to obtain a precipitate. Then a centrifugal separation was performed to the precipitate to produce red quantum dots, which can emit a light having a peak wavelength of 650 nm and a full width at half maximum of 35 nm.

Manufacturing of Quantum Dot Solution

Quantum Dot Solution (1)
A quantum dot solution (1) was produced by removing the solvent from the green quantum dot of the quantum dot synthesis example 1, and then adding n-hexane to make the green quantum dots being 1 wt % of the quantum dot solution (1).

Quantum Dot Solution (2)
A quantum dot solution (2) was produced by removing the solvent from the red quantum dots of the quantum dot synthesis example 2, and then adding n-hexane to make the red quantum dots being 1 wt. % of the quantum dot solution (2).

Manufacturing of Core Solution

[Core Solution (1)]
Silicon dioxide grains having an average diameter of 3 μm and hydrophobicity property, and being porous micro grains having an average surface aperture diameter of 10 nm and a specific surface area of 700 $m^2/g$ were used as the cores, and were mixed with n-hexane so as to produce a core solution (1) having the cores of 5 wt %.

[Core Solution (2)]
Silicon dioxide grains having an average diameter of 1 μm and hydrophobicity property, and being porous micro grains having an average surface aperture diameter of 10 nm and a specific surface area of 400 $m^2/g$ were used as the cores, and were mixed with n-hexane so as to produce a core solution (2) having the cores of 5 wt %.

[Core Solution (3)]
Silicon dioxide grains having an average diameter of 0.15 μm and hydrophobicity property, and being porous micro grains having an average surface aperture diameter of 5 nm and a specific surface area of 120 $m^2/g$ were used as the cores, and were mixed with n-hexane so as to produce a core solution (3) having the cores of 5 wt %.

[Core Solution (4)]
Silicon dioxide grains having an average diameter of 50 μm and hydrophobicity property, and being porous micro grains having an average surface aperture diameter of 12 nm and a specific surface area of 120 $m^2/g$ were used as the cores, and were mixed with n-hexane so as to produce a core solution (4) having the cores of 5 wt %.

[Core Solution (5)]
Fumed silica having an average diameter of 0.25 μm (trade name: SIS6960.0, manufactured by Gelest) of 1 g was dispersed in dimethyl sulfoxide of 40 g, and was added with hexadecyl trimethoxysilane of 0.2 g as a modification agent. The solution was heated to 85° C. under an environment of nitrogen gas, and was stirred for 72 hours to react. Then the solution was treated with a centrifugation, and was washed with ethanol for three times. The solvent of the solution was removed by drying with vacuum so as to produce fumed silica micro grains having hydrophobicity property as being the cores. The cores were mixed with n-hexane so as to produce a core solution (5) having the cores of 5 wt %.

Manufacturing of Particle

Particle Embodiment 1

The quantum dot solution (1) of 0.25 g and the core solution (1) of 5 g were mixed and stood for 10 minutes. Then the solution was filtered by a centrifugation method to obtain the cores attached with the quantum dots. Then the cores attached with the quantum dots were uniformly dispersed in ethanol of 250 g. Then the solution was added with tetraethoxysilane (TEOS) of 0.5 g and ammonium hydroxide ($NH_4OH$) of 29 wt % of 2.5 g, and was stirred for 4 hours at the room temperature during which a pH value of the solution was 10-11. A centrifugal separation was performed. The residuum was washed by using pure water for 3 times, and then dried to obtain micron-scaled particles. The particles were mixed with ethanol and uniformly dispersed therein. The solution was analyzed with the scanning electron microscope (SEM) to observe the particles, with the software of IMAGE-PRO Plus 6.0 (IMAGE-PRO is a registered trademark of Media Cybernetics Inc.) to select the grains and measure properties of which such as the average diameter, etc. The particles were analyzed with the PL to measure the luminous intensity of the peak. The luminescence retention rate (unit: %) is the ratio of $PL_{250}$ to $PL_{25}$. The $PL_{25}$ is the luminous intensity of the PL peak of the particles measured at the room temperature 25° C. The $PL_{250}$ is the luminous intensity of the PL peak of the particles measured at the room temperature after the particles are heated under the environment of 250° C. for 2 hrs.

Particle Embodiment 2 and 3

The particle embodiment 2 and the particle embodiment 3 were different from the particle embodiment 1 with the kind of the core solution as shown in a table 1.

Particle Embodiment 4

The particle embodiment 4 was different from the particle embodiment 1 with the kind and the amount of the core solution as shown in the table 1.

Particle Embodiment 5

The particle embodiment 5 was different from the particle embodiment 4 in that the particle embodiment 5 used the quantum dot solution (2).

Comparative Particle Example 1

The comparative particle example 1 was different from the particle embodiment 1 with the kind of the core solution as shown in the table 1.

Comparative Particle Example 2

The comparative particle example 2 was different from the particle embodiment 1 in that the comparative particle example 2 used no core solution as shown in the table 1.

Comparative Particle Example 3

The comparative particle example 3 was the particles obtained by removing the solvent from the quantum dot solution (1) of 0.25 g.

The table 1 also lists the average diameter and the luminescence retention rate of the particles. The luminescence retention rate (unit: %) is the ratio of the $PL_{250}$ to the $PL_{25}$.

TABLE 1

| | quantum dot solution | core solution (g) | | | | | silicon oxide (g) | stir time | particle average diameter | luminescence retention rate |
|---|---|---|---|---|---|---|---|---|---|---|
| | (1) (g) | (1) | (2) | (3) | (4) | (5) | TEOS | (hr) | (μm) | rate (%) |
| particle embodiment 1 | 0.25 | 5 | 0 | 0 | 0 | 0 | 0.5 | 4 | 3.0 | 75 |
| particle embodiment 2 | 0.25 | 0 | 5 | 0 | 0 | 0 | 0.5 | 4 | 1.0 | 69 |
| particle embodiment 3 | 0.25 | 0 | 0 | 5 | 0 | 0 | 1.0 | 4 | 0.16 | 75 |
| particle embodiment 4 | 7.5 | 0 | 0 | 0 | 0 | 5 | 0.5 | 4 | 0.26 | 67 |
| comparative particle example 1 | 0.25 | 0 | 0 | 0 | 5 | 0 | 0.5 | 4 | 51.3 | 39 |
| comparative particle example 2 | 0.25 | 0 | 0 | 0 | 0 | 0 | 0.5 | 4 | 0.027 | 30 |
| comparative particle example 3 | 0.25 | 0 | 0 | 0 | 0 | 0 | 0 | 0 | — | 2 |

There are at least the following phenomena observed from the foregoing experimental data. The luminescence retention of the comparative example 1 is poor due to the oversized average diameter of the cores having small effective surface area capable of adsorbing quantum dots under the same volume, easily resulting in the aggregation of the whole quantum dots. The luminescence retention rate of the comparative example 2, having only the quantum dots and the sealing layer without the cores, is also poor, due to easily aggregation of the quantum dots, resulting in loss of luminescence function. The luminescence retention rate of the comparative example 3, having only the quantum dots and having no core and no sealing layer, is very bad, due to lacking protection effect from the sealing layer, and more serious aggregation of the quantum dots, resulting in loss of luminescence function. Compared to the comparative examples, the particle embodiments 1-4 manufactured according to the concepts of the present disclosure all have better luminescence retention rates and higher reliability.

Luminescent Material

A table 2 lists the compositions and the luminescent properties of the luminescent material examples 1-5. The compositions of the luminescent material are different from each other in weight percentages of the particles and the phosphors occupying in the luminescent material based on the total weight of the particles and the phosphors.

The manufacturing method for the luminescent material are understood based on the manufacturing method for the luminescent material example 4 disclosed as the following. In the manufacturing method for the luminescent material example 4, β-SiAlON phosphor powders of model No. GR230 of Denka (having a primary peak wavelength of 542 nm, and a full width at half maximum of 54 nm) of 0.05 g were taken to be dispersed in a toluene solvent of 1 g. The particles obtained according to the particle embodiment 4 (having a primary peak wavelength of 529 nm, and a full width at half maximum of 25 nm) of 0.95 g were dispersed in another toluene solvent of 19 g. Then, the two solutions were mixed and stirred uniformly. A centrifugation with 10000 rpm was performed to the mixture solution, and then the supernatant liquid was removed. Then, the solution of the mixture was removed by a vacuum drying method to obtain powders of green luminescent material which comprises the β-SiAlON green phosphor powders and the green particles.

TABLE 2 characteristics of the luminescent material comprising the green particle and the β-SiAlON green phosphor powder

| | green particle | green phosphor | Full width at half maximum (nm) | peak wavelength (nm) | chromaticity coordinate x | y | luminance | luminous intensity |
|---|---|---|---|---|---|---|---|---|
| luminescent material example 1 | 0% | 100% | 54 | 542 | 0.3524 | 0.6249 | 218.7 | $6.05 \times 10^5$ |
| luminescent material example 2 | 80% | 20% | 29 | 530 | 0.2495 | 0.7073 | 83.1 | $4.01 \times 10^5$ |
| luminescent material example 3 | 90% | 10% | 27 | 530 | 0.2226 | 0.7288 | 73.4 | $4.01 \times 10^5$ |
| luminescent material example 4 | 95% | 5% | 27 | 530 | 0.2024 | 0.7452 | 68 | $3.95 \times 10^5$ |
| luminescent material example 5 | 100% | 0 | 25 | 529 | 0.1821 | 0.7611 | 62.1 | $3.85 \times 10^5$ |

A table 3 lists the compositions and the luminescent properties of the luminescent material examples 6-10. The compositions of the luminescent material examples 6-10 as shown in the table 3 are different from the compositions of the luminescent material examples 1-5 in that the green phosphors of the luminescent material examples 6-10 use YAG phosphor powder of model No. Y22L400 of Chi Mei Corporation (having a primary peak wavelength of 532 nm, and a full width at half maximum of 106 nm).

TABLE 3 characteristics of the luminescent material comprising the green particle and the YAG green phosphor powder

| | green particle | green phosphor | Full width at half maximum (nm) | peak wavelength (nm) | chromaticity coordinate x | y | luminance | luminous intensity |
|---|---|---|---|---|---|---|---|---|
| luminescent material example 6 | 0% | 100% | 106 | 532 | 0.3732 | 0.5730 | 269.8 | $5.08 \times 10^5$ |
| luminescent material example 7 | 80% | 20% | 31 | 530 | 0.3014 | 0.6459 | 100.5 | $3.99 \times 10^5$ |
| luminescent material example 8 | 90% | 10% | 28 | 530 | 0.2640 | 0.6823 | 82.9 | $3.99 \times 10^5$ |
| luminescent material example 9 | 95% | 5% | 27 | 530 | 0.2343 | 0.7115 | 75.3 | $3.94 \times 10^5$ |
| luminescent material example 10 | 100% | 0 | 25 | 529 | 0.1821 | 0.7611 | 62.1 | $3.85 \times 10^5$ |

From the results shown in the table 2 and the table 3, it could be found that as the content of the green particles in the luminescent material decreases, the luminance and the luminous intensity of the luminescent material increase, but at the same time there is also an increasing trend for the full width at half maximum of the PL peak for the luminescent material. Under a considering a trade-off between increasing the luminance and the luminous intensity and decreasing the PL full width at half maximum, the luminescent material 3 and the luminescent material 8, having 10 wt % of the phosphors, are preferable.

A table 4 lists display characteristics of the luminescent material examples 1-5 listed in the table 2. In the NTSC measurement, an area of a triangle defined by the $R(x,y)=(0.67,0.33)$, $G(x,y)=(0.21,0.71)$, and $B(x,y)=(0.14,0.08)$ of the CIE 1931 chromaticity coordinates is used as the standard triangle area as being NTSC 100%. Areas of triangles defined by the chromaticity coordinates of the luminescent material examples 1-5 and the $R(x,y)=(0.67,0.33)$ and $B(x,y)=(0.14,0.08)$ are compared to the standard triangle area to obtain the NTSC % of the luminescent material examples 1-5.

TABLE 4 luminescent property of luminescent material

| | chromaticity coordinate | | |
|---|---|---|---|
| | x | y | NTSC % |
| luminescent material example 1 | 0.3524 | 0.6249 | 74.5 |
| luminescent material example 2 | 0.2495 | 0.7073 | 96.43 |
| luminescent material example 3 | 0.2226 | 0.7288 | 102.15 |
| luminescent material example 4 | 0.2024 | 0.7452 | 106.5 |
| luminescent material example 5 | 0.1821 | 0.7611 | 110.76 |

According to the results shown in the table 4, it is estimated that the luminescent material can have the maximum content of the green phosphors (β-SiAlON) of 10 wt % of the luminescent material example 3 for being as close to NTSC 100% as possible. As the polynomial regression trend line (power: 2) obtained from a distribution diagram showing the contents of the green phosphors (β-SiAlON) and the values of the NTSC % of the luminescent material examples 1-5 ($y=45.048x^2-80.994x+110.45$; $R^2=0.9992$; wherein x represents the content of the β-SiAlON by weight percentage in the luminescent material, and y represents NTSC %) is taken to consider, it is estimated that the luminescent material can have the maximum content of the green phosphors of 13.9 wt %. For the luminescent material, the relationship between the included content of the green particles mixed with the green phosphors and the NTSC % is not a linear relationship. The maximum content of the green phosphors mixed in the luminescent material for achieving NTSC 100% can not be simply obtained by directly drawing a diagram according to two values of NTSC % of the green particle and the green phosphor, and calculating it with analogizing according to a linear proportional relationship, etc. Accordingly, in the luminescent material, the content of the green phosphors may be 5 wt % to 13.9 wt % based on the total content of the green particles and the green phosphors as 100 wt %, and the green phosphors have the primary luminescent peak wavelength of 530 nm to 550 nm, and the full width at half maximum of 40 nm to 60 nm.

A table 5 lists display characteristics of the luminescent material examples 6-10 listed in the table 3. In the NTSC measurement, the area of the triangle defined by the $R(x,y)=(0.67,0.33)$, $G(x,y)=(0.21,0.71)$, and $B(x,y)=(0.14,0.08)$ of the CIE 1931 chromaticity coordinates is used as the standard triangle area as being NTSC 100%. Areas of triangles defined by the chromaticity coordinates of the luminescent material examples 6-10 and the $R(x,y)=(0.67,0.33)$ and $B(x,y)=(0.14,0.08)$ are compared to the standard triangle area to obtain the NTSC % of the luminescent material examples 6-10.

TABLE 5 luminescent property of luminescent material

| | chromaticity coordinate | | |
|---|---|---|---|
| | x | y | NTSC % |
| luminescent material example 6 | 0.3732 | 0.573 | 64.16 |
| luminescent material example 7 | 0.3014 | 0.6459 | 82.04 |
| luminescent material example 8 | 0.264 | 0.6823 | 91.09 |
| luminescent material example 9 | 0.2343 | 0.7115 | 98.34 |
| luminescent material example 10 | 0.1821 | 0.7611 | 110.76 |

According to the results shown in the table 5, it is estimated that the luminescent material can have the maximum content of the green phosphors (YAG) of 5 wt % for being as close to NTSC 100% as possible. As the polynomial regression trend line (power: 2) obtained from a distribution diagram showing the contents of the green phosphors (YAG) and the values of the NTSC % of the luminescent material examples 7-10 ($y=576.73x^2-257.12x+110.49$; $R^2=0.9979$; wherein x represents the content of the YAG by weight percentage in the luminescent material, and y represents NTSC %) is taken to consider, it is estimated that the luminescent material can have the maximum content of the green phosphors of 4.8 wt %. For the luminescent material, the relationship between the included content of the green particles mixed with the green phosphors and the NTSC % is not a linear relationship. The maximum content of the green phosphors mixed in the luminescent material for achieving NTSC 100% can not be simply obtained by directly drawing a diagram according to two values of NTSC % of the green particle and the green phosphor, and calculating it with analogizing according to a linear proportional relationship, etc. Accordingly, in the luminescent material, the content of the green phosphors may be 0.1 wt % to 4.8 wt % based on the total content of the green particles and the green phosphors as 100 wt %, and the green phosphors have the primary luminescent peak wavelength of 530 nm to 550 nm, and the full width at half maximum of 70 nm to 108 nm.

Light Emitting Device

A table 6 lists characteristics of light emitting device examples 1-5 respectively using the green luminescent material examples 1-5 in the table 2 together with a LED element applying the red phosphor powders (PFS) and a blue LED chip. The blue LED chip uses the product model No. ES-EEDBF11P of EPISTAR Corporation, which can emit a light having a wavelength of 450 nm and a CIE chromaticity coordinate of $(x,y)=(0.1409,0.0547)$. The red phosphor powder uses the $K_2[SiF_6]:Mn^{4+}$ (potassium fluorosilicate $Mn^{4+}$ phosphor; PFS) product model of TriGain of GE, which can emit a light having a CIE chromaticity coordinate of $(x,y)=(0.691,0.307)$, a primary luminescent peak wavelength of 631 nm, and a full width at half maximum of 10 nm.

TABLE 6

| | luminescent property of light emitting device | |
|---|---|---|
| | luminescent material | NTSC % |
| light emitting device example 1 | luminescent material example 1 | 82.27 |
| light emitting device example 2 | luminescent material example 2 | 104.8 |
| light emitting device example 3 | luminescent material example 3 | 110.69 |
| light emitting device example 4 | luminescent material example 4 | 115.15 |
| light emitting device example 5 | luminescent material example 5 | 119.53 |

According to the results shown in the table 6, it is estimated that the luminescent material can have the maximum content of the green phosphors of 20 wt % of the luminescent material example 2 for being as dose to NTSC 100% as possible, when being applied together with the red phosphor powders (PFS) and the blue LED chip in an actual use. As the polynomial regression trend line (power: 2) obtained from a distribution diagram showing the mixed contents of the green phosphors (β-SiAlON) of the luminescent materials and the values of the NTSC % of light emitting devices ($y=46.306x^2-83.244x+119.22$; $R^2=0.9992$; wherein x represents the content of the β-SiAlON by weight percentage in the luminescent material, and y represents NTSC % of the light emitting device) is taken to consider, it is estimated that the luminescent material can have the maximum content of the green phosphors of 27.2 wt %. Accordingly, a light emitting device can have an additional red phosphor powder having a primary luminescent peak wavelength of 620 nm to 650 nm and a full width at half maximum of 8 nm to 30 nm; the green phosphors having a content of 5 wt % to 27.2 wt %, a primary luminescent peak wavelength of 530 nm to 550 nm, and a full width at half maximum of 40 nm to 60 nm; and the green particles having a content of 72.8 wt % to 95 wt %, a primary luminescent peak wavelength of 520 nm to 550 nm, and a full width at half maximum of 10 nm to 30 nm.

A table 7 lists characteristics of light emitting device examples 6-9 respectively using the green luminescent material examples 7-10 in the table 3 together with a LED element applying the said red phosphor powders (PFS) and the said blue LED chip.

TABLE 7

| | luminescent property of light emitting device | |
|---|---|---|
| | luminescent material | NTSC % |
| light emitting device example 6 | luminescent material example 7 | 89.99 |
| light emitting device example 7 | luminescent material example 8 | 99.3 |
| light emitting device example 8 | luminescent material example 9 | 106.75 |
| light emitting device example 9 | luminescent material example 10 | 119.53 |

According to the results shown in the table 7, it is estimated that the luminescent material can have the maximum content of the green phosphors of 5 wt % of the luminescent material example 9 for being as close to NTSC 100% as possible, when being applied together with the red phosphor powders (PFS) and the blue LED chip in an actual use. As the polynomial regression trend line (power: 2) obtained from a distribution diagram showing the mixed contents of the green phosphors (YAG) of the luminescent materials and the values of the NTSC % of light emitting devices ($y=593.27x^2-264.46x+119.25$; $R^2=0.9979$; wherein x represents the content of the YAG by weight percentage in the luminescent material, and y represents NTSC % of the light emitting device) is taken to consider, it is estimated that the luminescent material can have the maximum content of the green phosphors of 9.1 wt %. Accordingly, a light emitting device can have an additional red phosphor powder having a primary luminescent peak wavelength of 620 nm to 650 nm and a full width at half maximum of 8 nm to 30 nm; the green phosphors having a content of 0.1 wt % to 9.1 wt %, a primary luminescent peak wavelength of 530 nm to 550 nm, and a full width at half maximum of 70 nm to 108 nm; and the green particles having a content of 90.9 wt % to 99.9 wt %, a primary luminescent peak wavelength of 520 nm to 550 nm, and a full width at half maximum of 10 nm to 30 nm.

A table 8 lists characteristics of light emitting device examples 10-14 respectively using the green luminescent material examples 1-5 in the table 2 together with a LED element applying the red phosphor powders (CASN) and the blue LED chip. The blue LED chip uses the product model No. ES-EEDBF11P of EPISTAR Corporation, which can emit a light having a wavelength of 450 nm and a CIE chromaticity coordinate of $(x,y)=(0.1409,0.0547)$. The red phosphor powder uses the $CaAlSiN_3$:Eu (nitride phosphor; CASN) product model No. BR-101B of Mitsubishi Chemical Corporation, which can emit a light having a CIE chromaticity coordinate of $(x,y)=(0.682,0.318)$, a primary luminescent peak wavelength of 659 nm, and a full width at half maximum of 80 nm.

TABLE 8

| | luminescent property of light emitting device | |
|---|---|---|
| | luminescent material | NTSC % |
| light emitting device example 10 | luminescent material example 1 | 79.91 |
| light emitting device example 11 | luminescent material example 2 | 102.57 |
| light emitting device example 12 | luminescent material example 3 | 108.48 |
| light emitting device example 13 | luminescent material example 4 | 112.97 |
| light emitting device example 14 | luminescent material example 5 | 117.38 |

According to the results shown in the table 8, it is estimated that the luminescent material can have the maximum content of the green phosphors of 20 wt % of the luminescent material example 2 for being as close to NTSC 100% as possible, when being applied together with the red phosphor powders (CASN) and the blue LED chip in an actual use. As the polynomial regression trend line (power: 2) obtained from a distribution diagram showing the mixed contents of the green phosphors (β-SiAlON) of the luminescent materials and the values of the NTSC % of the light emitting devices ($y=46.554x^2-83.696x+117.06$; $R^2=0.9992$; wherein x represents the content of the β-SiAlON by weight percentage in the luminescent material, and y represents NTSC % of the light emitting device) is taken to consider, it is estimated that the luminescent material can have the maximum content of the green phosphors of 23.4 wt %. Accordingly, a light emitting device can have an additional red phosphor powder having a primary luminescent peak wavelength of 655 nm to 670 nm and a full width at half maximum of 50 nm to 82 nm; the green phosphors having a content of 5 wt % to 23.4 wt %, a primary luminescent peak wavelength of 530 nm to 550 nm, and a full width at half maximum of 40 nm to 60 nm; and the green particles having a content of 76.6 wt % to 95 wt %, a primary luminescent peak wavelength of 520 nm to 550 nm, and a full width at half maximum of 10 nm to 30 nm.

A table 9 lists characteristics of light emitting device examples 15-18 respectively using the green luminescent material examples 7-10 in the table 3 together with the LED element applying the said red phosphor powders (CASN) and the said blue LED chip.

TABLE 9 luminescent property of light emitting device

| | luminescent material | NTSC % |
|---|---|---|
| light emitting device example 15 | luminescent material example 7 | 87.75 |
| light emitting device example 16 | luminescent material example 8 | 97.09 |
| light emitting device example 17 | luminescent material example 9 | 104.55 |
| light emitting device example 18 | luminescent material example 10 | 117.38 |

According to the results shown in the table 9, it is estimated that the luminescent material can have the maximum content of the green phosphors of 5 wt % of the luminescent material example 9 for being as close to NTSC 100% as possible, when being applied together with the red phosphor powders (CASN) and the blue LED chip in an actual use. As the polynomial regression trend line (power: 2) obtained from a distribution diagram showing the mixed contents of the green phosphors (YAG) of the luminescent materials and the values of the NTSC % of light emitting devices ($y=595.36x^2-265.31x+117.09$; $R^2=0.9979$; wherein x represents the content of the YAG by weight percentage in the luminescent material, and y represents NTSC % of the light emitting device) is taken to consider, it is estimated that the luminescent material can have the maximum content of the green phosphors of 7.8 wt %. Accordingly, a light emitting device can have an additional red phosphor powder having a primary luminescent peak wavelength of 655 nm to 670 nm and a full width at half maximum of 50 nm to 82 nm; the green phosphors having a content of 0.1 wt % to 7.8 wt %, a primary luminescent peak wavelength of 530 nm to 550 nm, and a full width at half maximum of 70 nm to 108 nm; and the green particles having a content of 92.2 wt % to 99.9 wt %, a primary luminescent peak wavelength of 520 nm to 550 nm, and a full width at half maximum of 10 nm to 30 nm.

A table 10 lists characteristics of light emitting device examples 19-23 respectively using the green luminescent material examples 1-5 in the table 2 together with a LED element applying the red particle (having the red quantum dots) and a blue LED chip. The blue LED chip uses the product model no. ES-EEDBF11P of EPISTAR Corporation, which can emit a light having a wavelength of 450 nm and a CIE chromaticity coordinate of (x,y)=(0.1409,0.0547). The red particles use the particles manufactured in the particle embodiment 5, which can emit a light having a primary luminescent peak wavelength of 652 nm, a full width at half maximum of 35 nm, and a CIE chromaticity coordinate of (x,y)=(0.7145,0.2837).

TABLE 10 luminescent property of light emitting device

| | luminescent material | NTSC % |
|---|---|---|
| light emitting device example 19 | luminescent material example 1 | 88.06 |
| light emitting device example 20 | luminescent material example 2 | 110.45 |
| light emitting device example 21 | luminescent material example 3 | 116.29 |
| light emitting device example 22 | luminescent material example 4 | 120.73 |
| light emitting device example 23 | luminescent material example 5 | 125.08 |

According to the results shown in the table 10, it is estimated that the luminescent material can have the maximum content of the green phosphors of 20 wt % of the luminescent material example 2 for being as close to NTSC 100% as possible, when being applied together with the red particle (having the red quantum dots) and the blue LED chip in an actual use. As the polynomial regression trend line (power: 2) obtained from a distribution diagram showing the mixed contents of the green phosphors (β-SiAlON) of the luminescent materials and the values of the NTSC % of the light emitting devices ($y=45.989x^2-82.687x+124.77$; $R^2=0.9992$; wherein x represents the content of the β-SiAlON by weight percentage in the luminescent material, and y represents NTSC % of the light emitting device) is taken to consider, it is estimated that the luminescent material can have the maximum content of the green phosphors of 37.9 wt %. Accordingly, a light emitting device can have an additional red particle having a primary luminescent peak wavelength of 632 nm to 672 nm and a full width at half maximum of 20 nm to 40 nm; the green phosphors having a content of 5 wt % to 37.9 wt %, a primary luminescent peak wavelength of 530 nm to 550 nm, and a full width at half maximum of 40 nm to 60 nm; and the green particles having a content of 62.1 wt % to 95 wt %, a primary luminescent peak wavelength of 520 nm to 550 nm, and a full width at half maximum of 10 nm to 30 nm.

A table 11 lists characteristics of light emitting device examples 24-27 respectively using the green luminescent material examples 7-10 in the table 3 together with the LED element applying the said red particles (having the red quantum dots) and the said blue LED chip.

TABLE 11 luminescent property of light emitting device

| | luminescent material | NTSC % |
|---|---|---|
| light emitting device example 24 | luminescent material example 7 | 95.56 |
| light emitting device example 25 | luminescent material example 8 | 104.87 |
| light emitting device example 26 | luminescent material example 9 | 112.31 |
| light emitting device example 27 | luminescent material example 10 | 125.08 |

According to the results shown in the table 11, it is estimated that the luminescent material can have the maximum content of the green phosphors of 10 wt % of the luminescent material example 8 for being as close to NTSC 100% as possible, when being applied together with the red particle (having the red quantum dots) and the blue LED chip in an actual use. As the polynomial regression trend line (power: 2) obtained from a distribution diagram showing the mixed contents of the green phosphors (YAG) of the luminescent materials and the values of the NTSC % of light emitting devices ($y=592.36x^2-264.18x+124.8$; $R^2=0.9979$; wherein x represents the content of the YAG by weight percentage in the luminescent material, and y represents NTSC % of the light emitting device) is taken to consider, it is estimated that the luminescent material can have the maximum content of the green phosphors of 13.4 wt %. Accordingly, a light emitting device can have an additional red particle having a primary luminescent peak wavelength of 632 nm to 672 nm and a full width at half maximum of 20 nm to 40 nm; the green phosphors having a content of 0.1 wt % to 13.4 wt %, a primary luminescent peak wavelength of 530 nm to 550 nm, and a full width at half maximum of 70 nm to 108 nm; and the green particles having a content of 86.6 wt % to 99.9 wt %, a primary luminescent peak wavelength of 520 nm to 550 nm, and a full width at half maximum of 10 nm to 30 nm.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A luminescent material, consisting essentially of:
green particles comprise: a core, a sealing layer covering the core, and green quantum dots, the green particles have an average diameter of 0.06 μm to 30 μm; and
a green phosphor wherein: the green phosphor is mixed with the green particles,
a content of the green phosphor is 5 wt % to 13.9 wt % based on a total weight of the green particles and the green phosphor as 100 wt %, the green phosphor has a main peak wavelength of 530 nm to 550 nm, and a full width at half maximum of 40 nm to 60 nm,
a content of the green particles is 86.1 wt % to 95 wt % based on the total weight of the green particles and the green phosphor as 100 wt %, the green particles have a main peak wavelength of 520 nm to 550 nm, and a full width at half maximum of 10 nm to 30 nm, wherein:
the luminescent material is a green luminescent material, the content of the green phosphor mixed with the content of the green particles is for NTSC being equal to or larger than 100%, and
the NTSC is calculated by chromaticity coordinates of the green phosphor mixed with the green particles, $R(x,y)=(0.67,0.33)$ and $B(x,y)=(0.14,0.08)$.

2. The luminescent material according to claim 1, wherein the core is a non-photoluminescent material.

3. The luminescent material according to claim 1, wherein the sealing layer is least one selected from the group consisting of polysiloxane, glass and silicon dioxide.

4. The luminescent material according to claim 1, wherein the average diameter of the green particles is 0.10 μm to 10 μm.

5. The luminescent material according to claim 1, wherein the average diameter of the green particles is 0.15 μm to 3 μm.

6. A light emitting device, comprising:
a light emitting element; and
the luminescent material as claimed in claim 1 and configured for converting an exciting light emitted from the light emitting element to emit a light having a wavelength different from a wavelength of the exciting light.

7. The light emitting device according to claim 6, wherein the light emitting element comprises a red phosphor and a blue LED chip.

8. The light emitting device according to claim 7, wherein the red phosphor has a primary light having a peak wavelength of 620 nm to 670 nm, and a full width at half maximum of 8 nm to 82 nm.

9. The light emitting device according to claim 6, wherein the light emitting element comprises a red particle having red quantum dots and a blue LED chip.

10. The light emitting device according to claim 9, wherein the red particle has a primary light having a peak wavelength of 632 nm to 672 nm, and a full width at half maximum of 20 nm to 40 nm.

11. A display device, comprising:
a light emitting element; and
the luminescent material as claimed in claim 1 and configured for converting an exciting light emitted from the light emitting element to emit a light having a wavelength different from a wavelength of the exciting light, wherein the display device is a television, a digital camera, a digital video camera, a digital photo frame, a mobile phone, a laptop, a computer monitor, a portable music player, a gaming console, an automobile monitor, a smart watch or a virtual reality glasses.

12. The display device according to claim 11, wherein the light emitting element comprises a red phosphor and a blue LED chip; the red phosphor has a primary light having a peak wavelength of 620 nm to 670 nm, and a full width at half maximum of 8 nm to 82 nm.

13. The display device according to claim 11, wherein the light emitting element comprises a red particle has red quantum dots and a blue LED chip; the red particle has a primary light having a peak wavelength of 632 nm to 672 nm, and a full width at half maximum of 20 nm to 40 nm.

* * * * *